United States Patent [19]
Peters, Jr. et al.

[11] 3,899,339
[45] Aug. 12, 1975

[54] WATER SOLUBLE SOLDER RESIST

[75] Inventors: Henry G. Peters, Jr., Owego; Philipp W. H. Schuessler, Endwell, both of N.Y.

[73] Assignee: International Business Machines Corporation, Armonk, N.Y.

[22] Filed: Oct. 12, 1972

[21] Appl. No.: 297,118

[52] U.S. Cl. .......... 106/2; 117/5.5; 117/6; 117/8.5; 117/212
[51] Int. Cl. .......... C09d 5/20; B44d 1/52
[58] Field of Search .......... 106/2, 189; 117/5.5, 6, 117/8.5

[56] References Cited

UNITED STATES PATENTS

| | | | |
|---|---|---|---|
| 2,162,618 | 6/1939 | Izard | 117/6 |
| 2,970,064 | 1/1961 | Bolton | 117/5.5 |
| 2,991,188 | 7/1961 | Wing et al. | 117/5.5 |
| 3,531,311 | 9/1970 | Prior | 106/2 X |

OTHER PUBLICATIONS

Detergents and Emulsifiers, 1972, McCutcheon, TP990D4, p. 73.

"Detergents and Emulsifiers," 1971, McCutcheon, TP990D4, Allured Publishing Corp., 45 N. Broad St., Ridgewood, N. J. 07450.

*Primary Examiner*—Joseph L. Schofer
*Assistant Examiner*—Herbert J. Lilling
*Attorney, Agent, or Firm*—Kenneth P. Johnson

[57] ABSTRACT

Composition for water soluble maskant to prevent coating by molten solder where applied which includes an alkali metal silicate, humectant and water. A corrosion inhibitor may be added and a dye may be included for coloration.

1 Claim, No Drawings

WATER SOLUBLE SOLDER RESIST

BACKGROUND OF THE INVENTION

This invention relates generally to soldering processes and more particularly to a material that may be selectively applied to prevent adherence of molten solder.

During the production of electronic assemblies, one common method is to insert component leads into metal plated holes and lands in printed circuit boards with all leads extending from the same board surface. The loose assembly of components and board is then given a coating of flux to improve solder adherence, and passed through a wave of molten solder so that the entire surface of the board is contacted by the solder. As the board moves through the wave, solder that has wet the plated hole, land and component lead will solidify thus securing the assembly. Molten solder does not usually adhere to the circuit board substrate because the material holds no affinity therefor. Such material is frequently a polymeric resin with reinforcing fibers.

In this method of mass soldering, it is frequently desired to prevent certain holes and lands from becoming coated with solder, since these areas will be fitted at a subsequent process step with special components, for instance, those that cannot be subjected to cleaning baths. Therefore, in order to prevent the adherence of solder, a maskant or solder resist is usually applied. The resist can either cover the area to be preserved or be placed in the holes in the circuit board. The maskant is applied prior to the application of a solder flux and must be removable at the time the additional components are to be secured to the board.

Solder resists are well known in the art, but are subject to one or more of several disadvantages. Some resists require the application of special solvent for removal. Special solvents increase the masking expense and are frequently difficult to dispose of, resulting in added environmental pollutants. Frequently, a resist is not reliable in its adherence to the conductive metal, generally copper, so that inadvertent coating and bridging occur necessitating subsequent hand operation to remove the solder. This may be due to non-wetting or inability to withstand high soldering temperatures. Resists frequently have poor boundary definition because of the variation in viscosity, so that they may run over onto nearby connections which are intended to be soldered. At times there are contaminants within the resist which are removed by a solder wave and, after considerable time, require cleaning or replacement of the solder bath. A further experience is that some resists leave a corrosive residue at the connection joint, that is, the resist is never entirely removed so that the reliability of the solder joint is reduced.

Solder resists have been developed which are soluble in water and found to be highly desirable. These known resists, however, have been found to contain filler materials that are not readily cleaned off with the water wash unless large, unreasonable quantities of hot water and high pressure sprays are used. When the filler residue is left in place, it frequently provides an insulative layer around the component lead or on the hole surface which prevents electrical connection. A filler material can tend to wash off slightly during passage of the solder wave, thereby contaminating the solder bath.

It is accordingly a primary object of this invention to provide an improved water soluble solder resist which can be used with greater reliance that it will prevent the adherence of solder, that is non-reactive, and that can be completely and easily removed by water.

Another object of this invention is to provide a solder resist that readily wets the metallic areas where it is applied and is composed of inexpensive non-contaminating materials commonly available.

A further object of this invention is to provide a water soluble solder resist which contains a humectant that aids in maintaining pot life and in subsequent dissolution of the resistive coating, when desired.

Yet another object is to provide a water soluble solder resist that is not detrimental to the electrical quality of a joint even if some residue remains from the resist.

SUMMARY OF THE INVENTION

The foregoing objects are accomplished in accordance with the invention by providing a solder resist composed of an alkali metal silicate, preferably sodium silicate, a humectant such as a glycerine-type material, and water. In addition, there may be optionally added a corrosion-inhibiting agent and a tinting material such as a vegetable dye or a xanthene dyestuff.

The composition of this solder resist has been found to be reliably controllable with regard to viscosity and solubility by altering the proportions of the ingredients. For instance, by weight, the alkali metal silicate can be varied from 4 to 24%, and the humectant can vary from 5 to 10%, thus allowing water content to be from 66 to 92%. The optional corrosion inhibitor and coloring agents are extremely minor quantities with the inhibiting agent varying from 0.03 and 0.3%, and the dye content varying from 0.10 to 0.16%.

The solder resist of the invention is non-toxic, non-corrosive, does not contain filler material, and will provide less contamination of the solder bath. It is readily removable with warm water at approximately 140°F by either agitated immersion in a bath or by a light spray. The composition readily breaks down chemically so that it is considered as non-polluting to water supplies and can be directly discharged into drainage systems. The resist can also be applied by the usual techniques such as brushing, spraying or squeeze applicators. Because of the humecant, the shelf life after application is several weeks, whereas other known resists dry out and shrink so that the coatings loosen and fall off. In the event that the entire residue is not cleaned off, there is no detrimental effect on the subsequently soldered joint.

The foregoing and other objects, features and advantages of the invention will be apparent from the following more particular description of preferred embodiments of the invention.

DESCRIPTION OF THE PREFERRED EMBODIMENTS

The water soluble solder mask of the invention is predominately an alkali metal silicate admixed with a humectant in water. Sodium silicate in solution, commonly known as water glass, is preferred because it is the least expensive of the alkali metal silicates, and is readily available commercially. Commercial stock is saturated sodium silicate solution with the sodium silicate content varying with the consistency. For example, solutions at 40° Baume contain approximately 34%, at 33° Baume approximately 25%, and at 24° Baume approximately 20% sodium silicate.

The humectant preferred for use is any of several glycerine-type materials such as glycerol or the glycols. Its presence prevents complete drying and thus facilitates more rapid dissolution of the maskant during removal. Water is added to vary the consistency of the composition prior to application and may be either tap water or deionized water.

Several examples of the solder resist composition are set below:

EXAMPLE 1

A solder resist composition was prepared by mixing by weight, 50% commercially purchased saturated sodium silicate solution at 40° Baume (17% sodium silicate) with 5% glycerol and the remainder water. Thorough mixing of a 100 cc. sample required approximately 5 minutes. This material was then applied by brush to the tinned plated-through holes and lands of a portion of the holes of glass fiber-epoxy resin substrates. The applied maskant was dried for approximately five minutes in air until a firm, non-tacky surface was obtained. The coated substrates were then subjected to water soluble and rosin types of solder fluxes and passed in contact with a solder wave. None of the masked holes or lands had a further coating of solder thereon and the maskant was undisturbed where applied. Afterward the substrates were given a light spray and then immersed in warm water at approximately 140°F for 6 minutes, agitated slightly, and removed. The substrates were then both air and oven dried. Upon examination, no traces of the maskant were found in the formerly coated holes and lands.

EXAMPLE 2

Commercial sodium silicate solution at 33° Baume was mixed at the ratio of 50% sodium silicate solution (14% sodium silicate), 5% glycerol, and the remainder water. After mixing in the same manner for the same time as in Example 1, the maskant was again applied by brush to selected holes and lands in the circuit substrates in which the lands and plated-through holes were tinned and the maskant allowed to dry for 5 minutes in air. Water soluble flux was applied and the substrates were passed in contact with a solder wave. Thereafter, the substrate was immersed in water and dried as in Example 1 with the result that all formerly masked holes and lands showed no evidence of solder or maskant.

EXAMPLE 3

In this example, saturated sodium silicate solution at 40° Baume was increased to 70% sodium silicate solution (24% sodium silicate), 5% glycerol and the remainder water. Mixing required approximately 10 minutes. The material was then applied to the holes and lands of substrates as in the foregoing examples. It was noted, however, that application was required to be prompt, since the material formed a dry surface film almost immediately. Again, after application, the material was further dried in air for approximately 10 minutes and subjected to the same rinsing and drying techniques as in the foregoing examples. This composition was effective to block the adherence of solder where applied, but when subjected to the same cleaning techniques, a slight residue was found to remain on the coated areas. This residue was removed, however, by increasing the agitation and using a heavier spray.

EXAMPLES 4 AND 5

In these two examples, saturated sodium silicate solution at 40° Baume was mixed in the ratio of 50% solution (17% sodium silicate) with respective variations in the amount of glycerol which were 10 and 20% with the remainder water. No change in mixing time was required. In both of these examples, when each was applied as in the foregoing examples, it was noted that the drying time increased from five to 15 minutes over that required for the 5% glycerol.

The maskant was functional in preventing solder adherence in the material containing 10% glycerol. However, in the sample containing 20% glycerol, some of the plugs of maskant in the circuit holes were displaced and in others pushed out so that solder was found in those holes. The percentage of holes containing solder was found to be 5 to 10% on the substrates coated with the latter maskant. It was also noted that the maskant was not as easily removed and additional immersion and spraying of up to 6 minutes was necessary in order to clear the maskant from the coated areas.

EXAMPLE 6

In this instance, saturated sodium silicate solution at 40° Baume was added in the ratio of 10% solution (3.4% sodium silicate) with 5% glycerol and the remainder water. These proportions had a marked effect on the drying time, requiring 40 minutes, and extreme care had to be exercised during application in order to prevent running of maskant onto areas that were not to be coated.

Although the solder resist required extensive drying time, it was found to be reliably functional in preventing the deposition of solder when subjected to both the flux and solder waves. The material was removed by the technique given in Example 1 and no traces of maskant were found in the formerly coated holes and lands.

EXAMPLE 7

Commercial sodium silicate solution at 40° Baume was mixed at the ratio of 50% sodium silicate solution (17% sodium silicate) 5% ethylene glycol and the remainder water. Mixing time was found to be the same, and the material was applied to the tinned plated-through holes and lands of the circuit card by means of a brush. Drying required approximately 5 minutes in air. Samples of coated substrates were then subjected both to water soluble and rosin types of solder fluxes before being passed in contact with a solder wave. None of the masked holes or lands had evidence of any additional solder deposited thereon, and all masked holes were not filled with solder.

It was found that the light spray and immersion in warm water did not completely remove residue and a repeated stronger spray was used to remove all traces of the maskant.

Variations in the quantity of ethylene glycol were made from 3 to 10% with 50% of the 40° Baume sodium silicate solution and water, and, after coating and soldering, the same difficulty was noted in that rinsing of all residue required a high pressure spray and agitation in a bath.

It has been found in certain wave soldering applications that the baths to which the structure is being subjected should contain as a precautionary measure an anti-corrosion agent or a combined anti-corrosion and wetting agent to insure that portions of the coated holes and lands are not eventually corroded by the solder flux. In those situations where an anti-corrosion agent is required, the solder resist composition can be readily modified by the addition of a small amount of surfactant such as a fluorocarbon compound. The percentage range that has been tried with the above described maskants has been 0.03 to 0.3%. The surfactant used as FC 134, a quarternary amine iodide, 3M Brand from Minnesota Mining and Manufacturing Corporation at St. Paul, Minnesota. The quantities added to the solder resist compositions had no noticeable effect on the mixing, application, performance or removal of the composition, and it is probable that these amounts can be varied beyond the range attempted. The particular fluorocarbon used also had the additional advantage of serving as a wetting agent.

When the maskant composition is applied, it has been found that the coated areas are at times difficult to distinguish from the backgound since the maskant is substantially colorless. In order to make the coated areas readily visible, conventional vegetable dyes have been added in varying amounts from 0.1 to 0.16% by weight. The dyes that have been used are a green food dye from R. T. French Company, Rochester, N.Y. and a xanthene-based red dye, Rhodamine B Extra S from GAF Corporation, New York, N.Y. The coloring agent is added merely as a convenience and to an intensity to permit ready visibility of the coating. No effect was noted in the characteristics or performance of the solder resist.

As will be seen from the several examples given above, there is wide latitude in the amount of sodium silicate added to the solder resist composition. The principal determinant as to the proportion of sodium silicate is the drying time required by the maskant. When the maskant is to be used in a high volume production line, drying time becomes expensive because of temporary storage problem and work in process per unit time. It is therefore highly desirable that drying time be minimized. It is also desirable in this situation that the coating be readily and quickly removed after the application of solder. Conversely, in low volume processing additional drying or rinsing time can be tolerated. Accordingly, the amount of sodium silicate is widely variable according to manufacturing conditions requiring its use.

The amount of humectant is more critical in that small amounts permit the sodium silicate solution to dry too rapidly and too hard, thus requiring extended rinsing and spraying. On the other hand, when larger amounts of humectant are added such as 20% noted above, the solder resist remains soft and never achieves the requisite strength for reliability so that occasional coatings are forcibly removed by waves of either the flux or solder during processing. In cases where there is little force, the larger amounts of humectant can be tolerated.

In considering the applications of solder resist, it can be used to fill the smaller holes or to merely coat the surface of components or substrates that are not to be coated with solder. It has been found that the solder resist of the invention can be brushed onto the surfaces to be protected, or the larger surfaces to be preserved can be dip-coated or sprayed, if found desirable. The resist can be applied from a squeeze container if the composition of the maskant is relatively viscous.

While the invention has been particularly shown and described with reference to preferred embodiments thereof, it will be understood by those skilled in the art that the foregoing and other changes in form and details will be made therein without departing from the spirit and scope of the invention.

What is claimed is:

1. A masking composition to prevent deposition of molten solder consisting of by weight; 10 to 70% sodium silicate solution at 40° Baume, 5 to 10% of glycerol or glycol, 0.03 to 0.3% of a corrosion inhibitor which is a quarternary amine iodide, 0.1 to 0.6% of a xanthene tinting agent or non-reactive vegetable dye, and the remainder being water.

* * * * *